US010658573B2

(12) United States Patent
Sasaki

(10) Patent No.: US 10,658,573 B2
(45) Date of Patent: May 19, 2020

(54) MAGNETIC MEMORY

(71) Applicant: TDK CORPORATION, Tokyo (JP)

(72) Inventor: Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/598,280

(22) Filed: Oct. 10, 2019

(65) Prior Publication Data

US 2020/0044145 A1 Feb. 6, 2020

Related U.S. Application Data

(63) Continuation of application No. 15/781,576, filed as application No. PCT/JP2017/008801 on Mar. 6, 2018, now Pat. No. 10,490,735.

(30) Foreign Application Priority Data

Mar. 14, 2016 (JP) .................................. 2016-050266
Sep. 16, 2016 (JP) .................................. 2016-182359

(51) Int. Cl.
*G11C 11/02* (2006.01)
*H01L 43/08* (2006.01)
(Continued)

(52) U.S. Cl.
CPC ............ *H01L 43/08* (2013.01); *G01R 33/093* (2013.01); *G01R 33/098* (2013.01);
(Continued)

(58) Field of Classification Search
CPC .......... G11C 11/02–19; G11C 11/5607; G11C 14/0036
(Continued)

(56) References Cited

U.S. PATENT DOCUMENTS 9,830,968 B2 11/2017 Shimomura et al.
2002/0041515 A1* 4/2002 Ikeda .................... B82Y 10/00
365/158
(Continued)

FOREIGN PATENT DOCUMENTS

JP 2015-212996 A 11/2015
WO 2015/102739 A2 7/2015

OTHER PUBLICATIONS

May 16, 2017 International Search Report issued in International Patent Application No. PCT/JP2017/008801.
(Continued)

*Primary Examiner* — Han Yang
(74) *Attorney, Agent, or Firm* — Oliff PLC

(57) ABSTRACT

A magnetic memory includes magnetoresistance effect elements, each of which includes a first ferromagnetic metal layer in which a magnetization direction is fixed, a second ferromagnetic metal layer for a magnetization direction to be changed, and a nonmagnetic layer provided between the first ferromagnetic metal layer and the second ferromagnetic metal layer, a first wiring connected to the first ferromagnetic metal layer of at least one magnetoresistance effect element, spin-orbit torque wirings, each of which is connected to each of the second ferromagnetic metal layers of the magnetoresistance effect elements and extend in a direction intersecting a lamination direction of the magnetoresistance effect element, one first control element connected to the first wiring, one second control element connected to each of first connection points of the spin-orbit torque wirings, and first cell selection elements, each of which is connected to each of second connection points of the spin-orbit torque wirings.

10 Claims, 13 Drawing Sheets

(51) Int. Cl.

| | |
|---|---|
| *G11C 11/18* | (2006.01) |
| *G11C 11/16* | (2006.01) |
| *G01R 33/09* | (2006.01) |
| *G01R 33/12* | (2006.01) |
| *H01L 43/04* | (2006.01) |
| *H01L 43/06* | (2006.01) |
| *H01L 43/10* | (2006.01) |
| *H01L 21/8239* | (2006.01) |
| *H01L 27/22* | (2006.01) |

(52) U.S. Cl.
CPC ........ *G01R 33/1284* (2013.01); *G11C 11/161* (2013.01); *G11C 11/1675* (2013.01); *G11C 11/18* (2013.01); *H01L 21/8239* (2013.01); *H01L 27/228* (2013.01); *H01L 43/04* (2013.01); *H01L 43/06* (2013.01); *H01L 43/10* (2013.01)

(58) Field of Classification Search
USPC .................................. 365/148, 158, 171, 173
See application file for complete search history.

(56) References Cited

U.S. PATENT DOCUMENTS

| | | |
|---|---|---|
| 2009/0021999 A1 | 1/2009 | Tanimura et al. |
| 2010/0164094 A1 | 7/2010 | Chung |
| 2015/0036415 A1 | 2/2015 | Di Pendina et al. |
| 2018/0123022 A1* | 5/2018 | Sasaki ..................... G11C 11/18 |
| 2019/0051815 A1 | 2/2019 | Kakinuma et al. |

OTHER PUBLICATIONS

Miron et al., "Perpendicular switching of a single ferromagnetic layer induced by in-plane current injection." Nature, vol. 476, p. 189-194 (Aug. 11, 2011).
Mar. 21, 2019 Office Action issued in U.S. Appl. No. 15/781,576.
D. Wan et al. "Fabrication of magnetic tunnel junctions connected through a continuous layer to enable spin logic devices." Japanese Journal of Applied Physics. vol. 57, No. 4S, Feb. 6, 2018.
Jul. 11, 2019 Notice of Allowance and Fee(s) Due issued in U.S. Appl. No. 15/781,576.

* cited by examiner

MAGNETIC MEMORY

CROSS REFERENCE

This Application is a Continuation Application of U.S. patent application Ser. No. 15/781,576, filed Jun. 5, 2018, which is a National Stage entry of PCT/JP2017/008801, filed Mar. 6, 2017, which claims the benefit of priority of Japanese Patent Application No. 2016-182359, filed on Sep. 16, 2016, and Japanese Patent Application No. 2016-050266, filed on Mar. 14, 2016. The entire disclosures of the aforementioned applications are expressly incorporated by reference herein.

TECHNICAL FIELD

The present invention relates to a magnetic memory.

Priority is claimed on Japanese Patent Application No. 2016-050266, filed Mar. 14, 2016, and Japanese Patent Application No. 2016-182359, filed Sep. 16, 2016, the content of which is incorporated herein by reference.

BACKGROUND ART

Giant magnetoresistance (GMR) elements and tunneling magnetoresistance (TMR) elements are known as magnetoresistance effect elements. GMR elements are composed of a multi-layer film including a ferromagnetic layer and a nonmagnetic layer. In TMR elements, an insulating layer (tunnel barrier layer, barrier layer) is used as a nonmagnetic layer. Generally, an element resistance of a TMR element is higher than an element resistance of a GMR element. However, a magnetoresistance (MR) ratio of a TMR element is higher than an MR ratio of a GMR element. Magnetoresistance effect elements are being focused on as magnetic sensors, high frequency components, magnetic heads and nonvolatile random access memory (MRAM) elements.

As a writing method for an MRAM, a method of performing writing using a magnetic field caused by a current (using magnetization inversion), a method of performing writing using a spin transfer torque (SIT) generated by applying a current in a lamination direction of magnetoresistance elements (using magnetization inversion), and the like are known. In the method of performing writing using a magnetic field, there is a limit to a current that can flow into a thin wiring and there is a risk of writing not being possible when an element size becomes smaller.

On the other hand, in the method of using a spin transfer torque (STT), a current is applied in the lamination direction of the magnetoresistance effect element. A spin-polarized current in one ferromagnetic layer (fixed layer, reference layer) is transferred to the other ferromagnetic layer (free layer, recording layer). According to this transfer, a spin transfer torque (STT) is applied to magnetization of the other ferromagnetic layer (free layer, recording layer), and writing (magnetization inversion) is performed. Therefore, when the element size is smaller, a current required for writing becomes lower, and there is an advantage that integration becomes easier.

CITATION LIST

Non Patent Literature

[Non Patent Literature 1]
I. M. Miron, K. Garello, G. Gaudin, P.-J. Zermatten, M. V. Costache, S. Auffret, S. Bandiera, B. Rodmacq, A. Schuhl, and P. Gambardella, Nature, 476, 189 (2011).

SUMMARY OF INVENTION

Technical Problem

However, while magnetization inversion of a TMR element using an STT is efficient in consideration of energy efficiency, there is a risk of an inversion current density for causing magnetization inversion being higher. The inversion current density is desirably low in consideration of prolonging a lifespan of the TMR element. This similarly applies to a GMR element.

Therefore, in either of the magnetoresistance effect elements of the TMR element and the GMR element, it is desirable to reduce a density of a current that flows into the magnetoresistance effect element.

In recent years, magnetization inversion using a pure spin current generated by spin orbit interaction has been studied (for example, Non Patent Literature 1). A pure spin current generated by spin orbit interaction induces a spin-orbit torque (SOT) and magnetization inversion is caused by the SOT. The pure spin current is generated when the same numbers of upward spin electrons and downward spin electrons flow in opposite directions. Therefore, an electric charge flow is canceled out and the current becomes zero. That is, in a magnetoresistance effect element using an SOT, a current that flows in the lamination direction of the magnetoresistance effect element becomes zero, which is expected in consideration of prolonging a lifespan.

However, for magnetoresistance effect elements using an SOT generated by a spin orbit interaction, research on applications in view of practical uses has only just begun. In actual production of magnetoresistance effect elements using an SOT as a magnetic memory, various problems such as how to perform suitable integration need to be taken into account.

The present invention has been realized in view of the above problems, and an object of the present invention is to provide a magnetic memory in which magnetoresistance effect elements using an SOT generated by a spin orbit interaction can be efficiently integrated.

Solution to Problem

In order to address the above problems, the present invention provides the following aspects.

A magnetic memory according to a first aspect includes a plurality of magnetoresistance effect elements, each of which includes a first ferromagnetic metal layer in which a magnetization direction is fixed, a second ferromagnetic metal layer for a magnetization direction to be changed, and a nonmagnetic layer that is provided between the first ferromagnetic metal layer and the second ferromagnetic metal layer; a first wiring that is connected to the first ferromagnetic metal layer of at least one magnetoresistance effect element among the plurality of magnetoresistance effect elements; a plurality of spin-orbit torque wirings, each of which is connected to each of the second ferromagnetic metal layers of the plurality of magnetoresistance effect elements and extends in a direction intersecting a lamination direction of the magnetoresistance effect elements; at least one first control element that is connected to the first wiring and is configured to control a current that flows into the magnetoresistance effect element; at least one second control element that is connected to each of first connection points of the plurality of spin-orbit torque wirings and is configured to control a current that flows into the spin-orbit torque wirings; and a plurality of first cell selection elements, each of which is connected to each of second connection points of the plurality of spin-orbit torque wirings, respectively.

The magnetoresistance effect element may be interposed between the first connection point and the second connection point when viewed from the lamination direction.

The magnetic memory may further include a plurality of second cell selection elements, each of which is connected to each of third connection points of the plurality of spin-orbit torque wirings, and the third connection points may be provided at positions at which the third connection points overlap the magnetoresistance effect element when viewed from the lamination direction.

The magnetic memory may further include a data erasing element that is connected to each of the second connection points of the plurality of spin-orbit torque wirings and is configured to collectively control directions of magnetization of the second ferromagnetic metal layers of the plurality of magnetoresistance effect elements.

The spin-orbit torque wirings may include a nonmagnetic metal having a d electron or a f electron in the outermost shell and having an atomic number of 39 or higher.

When the first wiring is connected to the plurality of magnetoresistance effect elements, a rectifying element may be provided between each of the plurality of magnetoresistance effect elements and the first control element.

A potential of the first control element may be higher than a potential of the second control element.

An area resistance of the nonmagnetic layer may be higher than 1000 $\Omega \cdot \mu m^2$.

A magnetic memory according to a second aspect includes a magnetoresistance effect element that includes a first ferromagnetic metal layer in which a magnetization direction is fixed, a second ferromagnetic metal layer for a magnetization direction to be changed, and a nonmagnetic layer that is provided between the first ferromagnetic metal layer and the second ferromagnetic metal layer; a plurality of drive elements, each of which is connected to the second ferromagnetic metal layer of the magnetoresistance effect element and includes spin-orbit torque wirings extending in a direction intersecting a lamination direction of the magnetoresistance effect element; a plurality of first control elements that are connected to each of the first ferromagnetic metal layers of the plurality of drive elements; at least one second control element that is connected to a first connection point of spin-orbit torque wirings of at least two drive elements among the plurality of drive elements; and a plurality of first cell selection elements, each of which is connected to each of second connection points of the spin-orbit torque wirings of the plurality of drive elements.

A magnetic memory according to a third aspect includes a magnetoresistance effect element that includes a first ferromagnetic metal layer in which a magnetization direction is fixed, a second ferromagnetic metal layer for a magnetization direction to be changed, and a nonmagnetic layer that is provided between the first ferromagnetic metal layer and the second ferromagnetic metal layer; a plurality of drive elements, each of which is connected to the second ferromagnetic metal layer of the magnetoresistance effect element and includes the spin-orbit torque wirings extending in a direction intersecting a lamination direction of the magnetoresistance effect element; at least one first control element that is connected to the first ferromagnetic metal layer of at least two drive elements among the plurality of drive elements; a plurality of second control elements, each of which is connected to each of the first connection points, respectively of the spin-orbit torque wirings of the plurality of drive elements; and a plurality of first cell selection elements, each of which is connected to each of second connection points of the spin-orbit torque wirings of the plurality of drive elements, respectively.

Advantageous Effects of Invention

According to the magnetic memory according to the above aspects, it is possible to efficiently integrate magnetoresistance effect elements using a pure spin current generated by spin orbit interaction.

DESCRIPTION OF EMBODIMENTS

Figure 1:
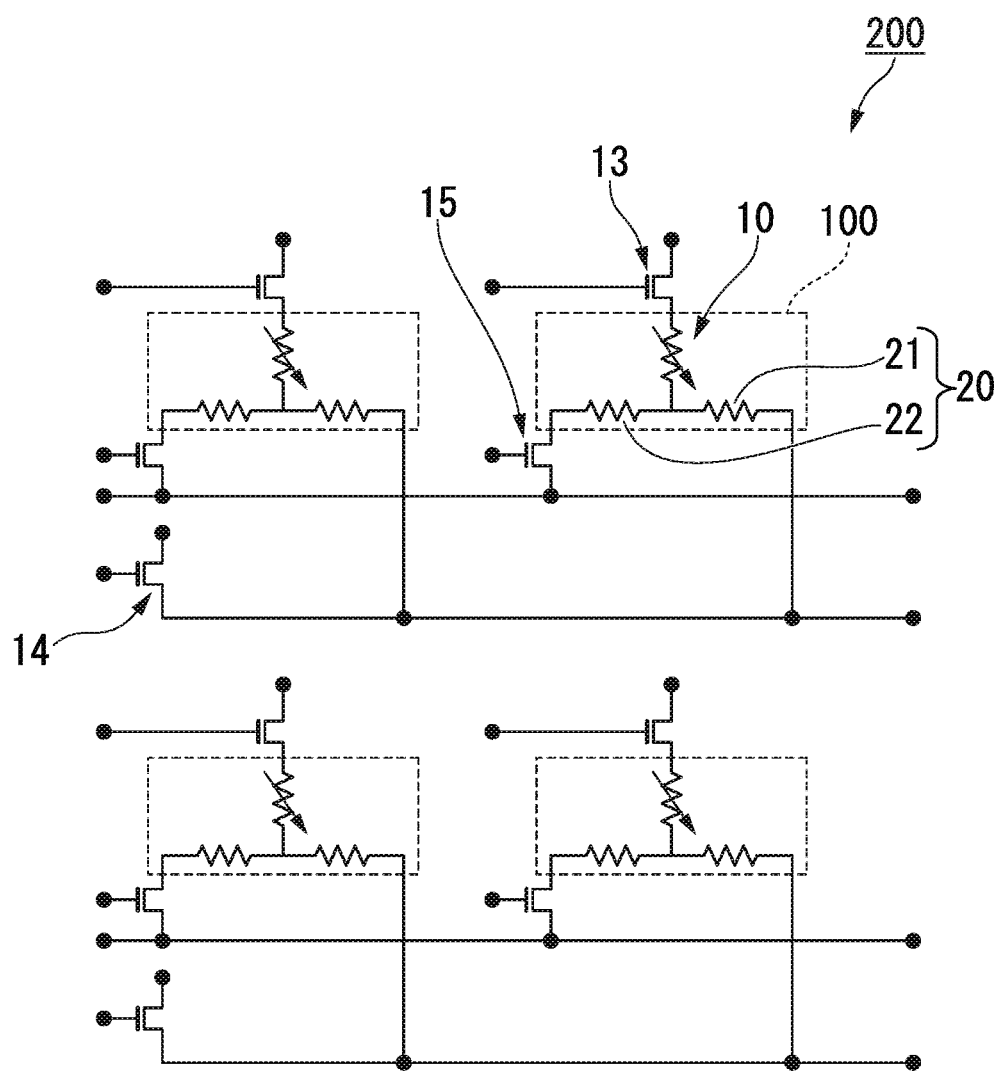
FIG. 1 is a circuit diagram of a magnetic memory according to a first embodiment.

Embodiments of the present invention will be appropriately described below in detail with reference to the drawings. In the drawings used in the following description, in order to facilitate understanding of features of the present invention, feature parts are enlarged for convenience of illustration in some cases, and size ratios and the like between components may be different from actual components. Materials, sizes, and the like exemplified in the following description are examples not limiting the present invention, and they can be appropriately changed within a range in which effects of the present invention are obtained.

First Embodiment

<Magnetic Memory (Circuit Diagram)>

Figure 2:
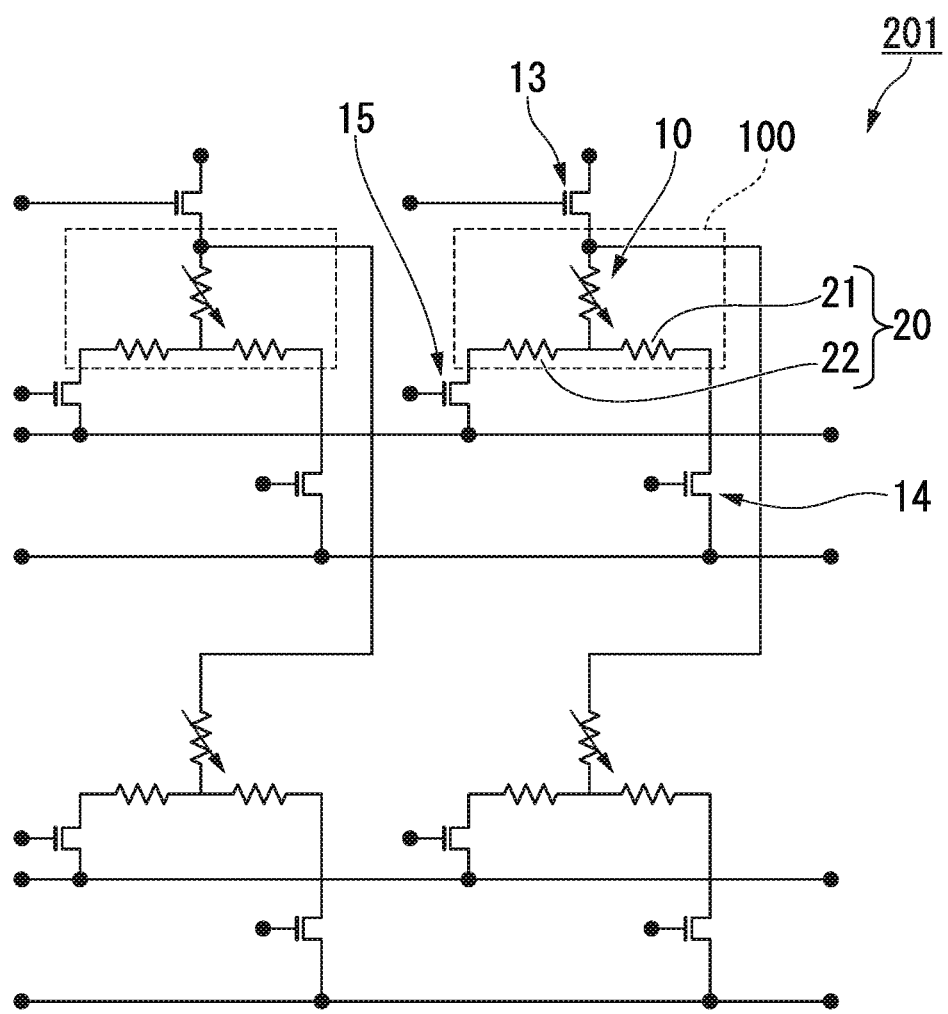
FIG. 2 is a circuit diagram of another example of a magnetic memory according to another example of the first embodiment.

FIG. 1 and FIG. 2 are circuit diagrams of a magnetic memory according to the present embodiment. A magnetic memory 200 includes a plurality of drive elements 100. The drive element 100 includes a magnetoresistance effect element 10 and a spin-orbit torque wiring 20. In the circuits in FIG. 1 and FIG. 2, the spin-orbit torque wiring 20 is shown as resistors 21 and 22. Current leakage during writing and reading is low in both the magnetic memory 200 shown in FIG. 1 and a magnetic memory 201 shown in FIG. 2, which function as magnetic memories.

In the magnetic memory 200 shown in FIG. 1 and the magnetic memory 201 shown in FIG. 2, a first control element 13, a second control element 14, and a first cell selection element 15 are connected to one drive element 100. Known transistors such as a field-effect transistor (FET) are used for such control elements.

When the first control element 13 and the first cell selection element 15 are operated (are brought into an "ON" state), a current can flow in a lamination direction of the magnetoresistance effect element 10, and a change in the resistance value of the magnetoresistance effect element 10 can be read. In addition, when the second control element 14 and the first cell selection element 15 are operated (are brought into an "ON" state), a current can flow into the spin-orbit torque wiring 20, and magnetization inversion (writing) of the magnetoresistance effect element 10 can be performed.

In the magnetic memory 200 shown in FIG. 1, the second control element 14 is connected over at least two of the drive elements 100. Therefore, it is sufficient to provide one second control element 14 at an end of an integrated substrate and the like. In other words, the second control element 14 does not greatly influence the integration of the magnetic memory 200.

Similarly, in the magnetic memory 201 shown in FIG. 2, the first control element 13 is connected over at least two of the drive elements 100. Therefore, it is sufficient to provide one first control element 13 at an end of an integrated substrate and the like. In other words, the first control element 13 does not greatly influence the integration of the magnetic memory 201.

In any case, a unit cell including one drive element 100 and two control elements influences the integration of the magnetic memory. The two control elements are the first control element 13 and the first cell selection element 15 in the magnetic memory 200 shown in FIG. 1, and are the second control element 14 and the first cell selection element 15 in the magnetic memory 201 shown in FIG. 2.

In order to drive the drive elements 100, at least three control elements are necessary. However, in consideration of a degree of integration, it is sufficient to consider disposition of a unit cell including one drive element and two control elements.

(Circuit Structure)

Figure 3:
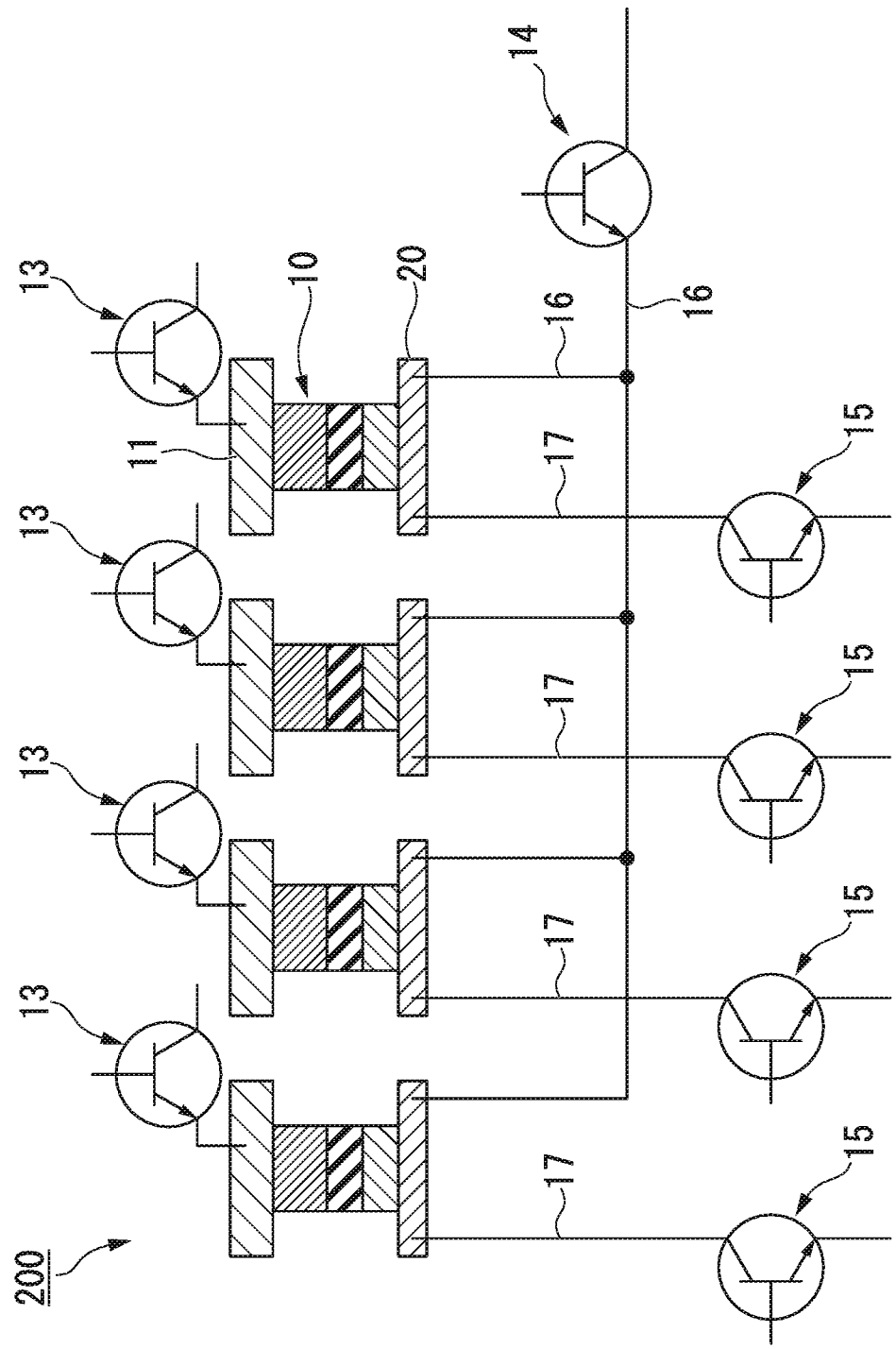
FIG. 3 is a schematic diagram of a circuit structure of the magnetic memory according to the first embodiment.

FIG. 3 is a schematic diagram schematically showing a circuit structure of a magnetic memory according to a first embodiment. The schematic diagram shown in FIG. 3 corresponds to the circuit diagram shown in FIG. 1.

The magnetic memory 200 according to the first embodiment includes the magnetoresistance effect element 10, a first wiring 11, the spin-orbit torque wiring 20, the first control element 13, the second control element 14, and the first cell selection element 15.

<Magnetoresistance Effect Element>

Figure 4:
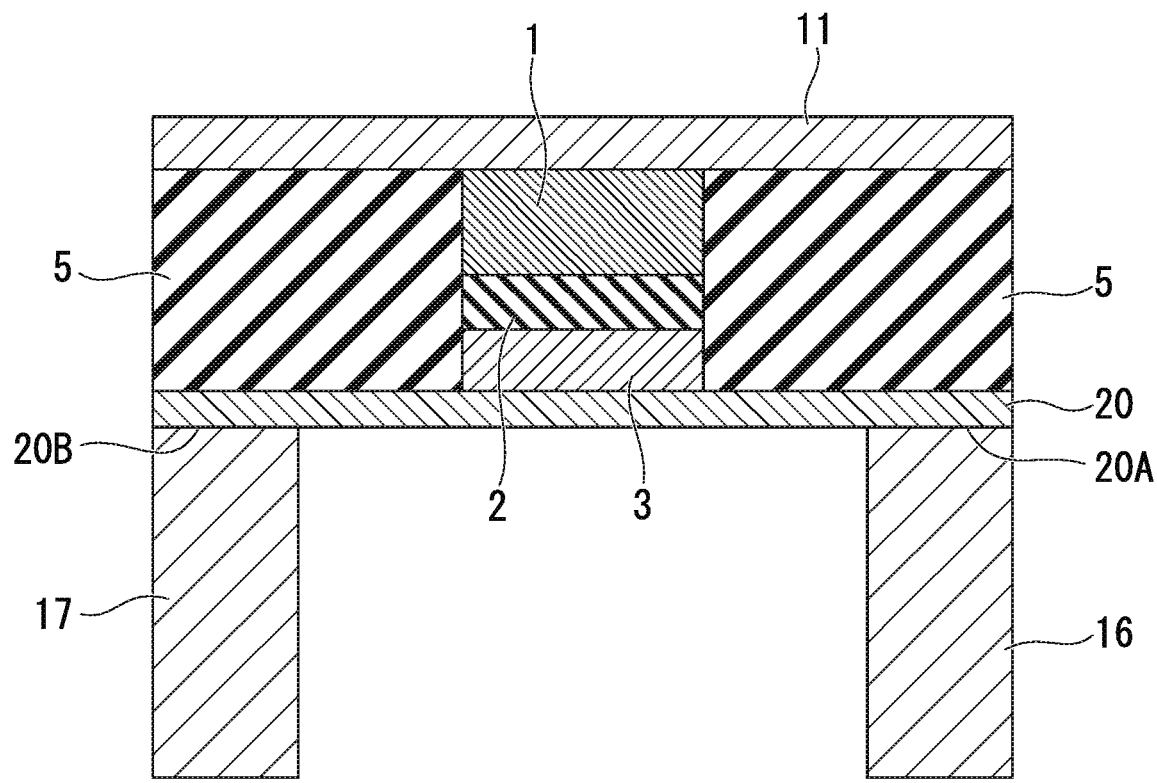
FIG. 4 is a schematic cross-sectional view of a main part in the vicinity of a magnetoresistance effect element of the magnetic memory according to the first embodiment.

FIG. 4 is a schematic cross-sectional view of an enlarged main part in the vicinity of the magnetoresistance effect element of the magnetic memory according to the first embodiment.

As shown in FIG. 4, the magnetoresistance effect element 10 includes a first ferromagnetic metal layer 1, a nonmagnetic layer 2, and a second ferromagnetic metal layer 3. The nonmagnetic layer 2 is interposed between the first ferromagnetic metal layer 1 and the second ferromagnetic metal layer 3.

In FIG. 4, an insulating part 5, a second wiring 16, and a third wiring 17 are shown together. The insulating part 5 insulates a gap between the first wiring 11 and the spin-orbit torque wiring 20 with the magnetoresistance effect element 10 therebetween. The second wiring 16 is a wiring that is provided between a first connection point 20A of the spin-orbit torque wiring 20 and the second control element 14. The third wiring 17 is a wiring that is provided between a second connection point 20B of a spin-orbit torque wiring 12 and the first cell selection element 15.

The magnetization of the first ferromagnetic metal layer 1 is fixed in one direction. When a direction of magnetization of the second ferromagnetic metal layer 3 relatively changes with respect to a direction of magnetization of the first ferromagnetic metal layer 1, it functions as the magnetoresistance effect element 10. In application to a coercive force difference type (pseudo spin valve type) MRAM, a coercive force of the first ferromagnetic metal layer is larger than a coercive force of the second ferromagnetic metal layer. In application to an exchange bias type (spin valve type) MRAM, the magnetization of the first ferromagnetic metal layer is fixed by exchange coupling with an anti-ferromagnetic layer.

The magnetoresistance effect element 10 is a tunneling magnetoresistance (TMR) element when the nonmagnetic layer 2 is made of an insulator, and is a giant magnetoresistance (GMR) element when the nonmagnetic layer 2 is made of a metal.

For the magnetoresistance effect element 10, a configuration of a known magnetoresistance effect element can be used. For example, each layer of the magnetoresistance effect element 10 may be composed of a plurality of layers, and may include another layer such as an anti-ferromagnetic layer for fixing a magnetization direction of the first ferromagnetic metal layer 1.

The first ferromagnetic metal layer 1 is called a fixed layer or a reference layer, and the second ferromagnetic metal layer 3 is called a free layer or a recording layer.

The first ferromagnetic metal layer 1 and the second ferromagnetic metal layer 3 may be either an in-plane magnetization film of which a magnetization direction is an in-plane direction that is parallel to the layer or a perpendicular magnetization film of which a magnetization direction is a direction perpendicular to the layer.

A known material can be used for the first ferromagnetic metal layer 1. For example, a metal selected from the group consisting of Cr, Mn, Co, Fe and Ni or an alloy containing at least one of such metals and exhibiting ferromagnetism can be used for the first ferromagnetic metal layer 1. In addition, an alloy containing such a metal and at least one element of B, C, and N can be used for the first ferromagnetic metal layer 1. Specifically, Co—Fe and Co—Fe—B may be exemplified.

In order to obtain a higher output, a Heusler alloy such as $Co_2FeSi$ is preferably used for the first ferromagnetic metal layer 1. A Heusler alloy contains an intermetallic compound having a chemical composition of $X_2YZ$. In the periodic table, X is a transition metal element from the Co, Fe, Ni, or Cu groups or a noble metal element, Y is a transition metal from the Mn, V, Cr or Ti groups or an element of type X, and Z is a typical element from Group III to Group V. For example, $Co_2FeSi$, $Co_2MnSi$ and $Co_2Mn_{1-a}Fe_aAl_bSi_{1-b}$ may be exemplified.

An anti-ferromagnetic layer containing an antiferromagnetic material such as IrMn and PtMn may be adjacent to the first ferromagnetic metal layer 1. A coercive force of the first ferromagnetic metal layer 1 with respect to the second ferromagnetic metal layer 3 then becomes larger. In order to prevent a leakage magnetic field of the first ferromagnetic metal layer 1 from influencing the second ferromagnetic metal layer 3, the magnetoresistance effect element 10 may have a structure of synthetic ferromagnetic bonding.

When a direction of magnetization of the first ferromagnetic metal layer 1 is made perpendicular to a lamination surface, a laminated film including Co and Pt is preferably used. For example, the first ferromagnetic metal layer 1 may be [Co (0.24 nm)/Pt (0.16 nm)]$_6$/Ru (0.9 nm)/[Pt (0.16 nm)/Co (0.16 nm)]$_4$/Ta (0.2 nm)/FeB (1.0 nm).

For the second ferromagnetic metal layer 3, a ferromagnetic material, and particularly, a soft magnetic material, can be applied. For example, for the second ferromagnetic metal layer 3, a metal selected from the group consisting of Cr, Mn, Co, Fe and Ni, an alloy containing at least one of such metals, an alloy containing such a metal and at least one element of B, C, and N, and the like may be exemplified. As specific materials according to this, Co—Fe, Co—Fe—B, and Ni—Fe may be exemplified.

When a direction of magnetization of the second ferromagnetic metal layer 3 is made perpendicular to a lamination surface, the thickness of the second ferromagnetic metal layer 3 is preferably 2.5 nm or less. At an interface between the second ferromagnetic metal layer 3 and the nonmagnetic layer 2, perpendicular magnetic anisotropy can be applied to the second ferromagnetic metal layer 3. Since the effect of the perpendicular magnetic anisotropy is reduced when the film thickness of the second ferromagnetic metal layer 3 is thicker, the film thickness of the second ferromagnetic metal layer 3 is preferably thinner.

For the nonmagnetic layer 2, a known material can be used.

For example, when the nonmagnetic layer 2 is made of an insulator (in the case of a tunnel barrier layer), $Al_2O_3$, $SiO_2$, Mg, $MgAl_2O_4$ or the like can be used for a material thereof. In addition to these materials, a material in which some of Al, Si, and Mg is substituted with Zn, Be, or the like can be used for the nonmagnetic layer 2. Among such materials, since MgO and $MgAl_2O_4$ are materials that can realize a coherent tunnel, spins can be transmitted efficiently.

When the nonmagnetic layer 2 is made of a metal, Cu, Au, Ag, or the like can be used as the material.

The magnetoresistance effect element 10 may include a known layer other than the first ferromagnetic metal layer 1, the nonmagnetic layer 2 and the second ferromagnetic metal layer 3. For example, a cap layer for improving a stability of a crystal orientation and magnetic properties and the like may be included.

<First Wiring>

The first wiring 11 is provided in at least one magnetoresistance effect element 10 among the plurality of magnetoresistance effect elements 10. The first wiring 11 is electrically connected to the first ferromagnetic metal layer 1 of each of the plurality of magnetoresistance effect elements 10.

The first wiring 11 is not particularly limited as long as it is a highly conductive material. For example, aluminum, silver, copper, gold, or the like can be used.

<Spin-Orbit Torque Wiring>

The spin-orbit torque wiring 20 extends in a direction intersecting a lamination direction of the magnetoresistance effect element 10. The spin-orbit torque wiring 20 is provided in each of the plurality of magnetoresistance effect elements 10. The spin-orbit torque wiring 20 is connected to the second ferromagnetic metal layer 3 of each of the magnetoresistance effect elements 10.

The spin-orbit torque wiring 20 is electrically connected to a power supply that supplies a current to the spin-orbit torque wiring 20, and functions as a spin injection unit configured to inject a pure spin current into the magnetoresistance effect element 10 together with the power supply.

The spin-orbit torque wiring 20 may be directly connected to the second ferromagnetic metal layer 3, and may be connected thereto with another layer therebetween.

The spin-orbit torque wiring 20 contains a material in which a pure spin current is generated due to a spin Hall effect when a current flows. It is sufficient that the spin-orbit torque wiring 20 has a configuration in which a pure spin current can be generated in the spin-orbit torque wiring 20. Therefore, the present invention is not limited to a configuration including a single element, and a configuration including a part made of a material in which a pure spin current is generated and a part made of a material in which no pure spin current is generated may be used.

The spin Hall effect is a phenomenon in which a pure spin current is induced in a direction perpendicular to a direction of a current based on spin orbit interaction when the current flows in the material.

Figure 5:
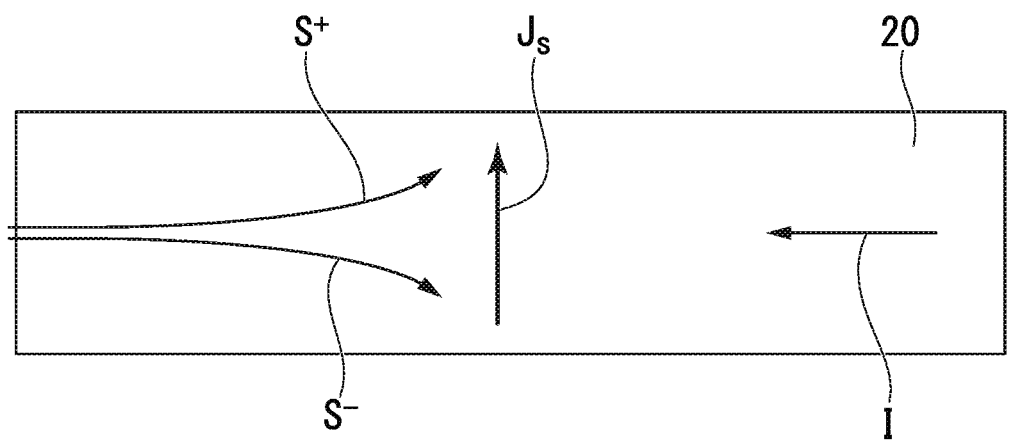
FIG. 5 is a schematic diagram for explaining a spin Hall effect.

FIG. 5 is a schematic diagram for explaining a spin Hall effect. A mechanism in which a pure spin current is generated due to a spin Hall effect will be described with reference to FIG. 5.

As shown in FIG. 5, when a current I flows in an extension direction of the spin-orbit torque wiring 20, the upward spin $S^+$ and the downward spin $S^-$ are each bent in a direction perpendicular to the current. The normal Hall effect and the spin Hall effect are the same in that an electric charge (electron) that is mobile (moves) is bent in a motion (movement) direction. On the other hand, in the normal Hall effect, charged particles that are mobile in a magnetic field receive a Lorentz force and a motion direction is bent, whereas, in the spin Hall effect, although there is no magnetic field, if only an electron moves (a current flows), a movement direction is bent, which is a large difference.

In a nonmagnetic component (a material which is not a ferromagnetic component), the number of electrons with an upward spin $S^+$ and the number of electrons with a downward spin $S^-$ are the same. In the drawing, the number of electrons with an upward spin $S^-$ moving in an upward direction and the number of electrons with a downward spin $S^-$ moving in a downward direction are the same. Therefore, a current as a net flow of electric charges is zero. This current-less spin current is particularly called a pure spin current.

On the other hand, when a current flows in a ferromagnetic component, the fact that upward spin electrons and downward spin electrons are bent in opposite directions is the same. However, the ferromagnetic component is in a state in which one of the numbers of upward spin electrons or downward spin electrons is large. Therefore, as a result, a net flow of electric charges occurs (a voltage is generated). Therefore, a material including only a ferromagnetic component is not included as a material of the spin-orbit torque wiring 20.

When a flow of electrons with an upward spin $S^+$ is represented by $J_\uparrow$, a flow of electrons with a downward spin $S^-$ is represented by $J_\downarrow$, and a spin current represented by $J_S$, $J_S=J_\uparrow-J_\downarrow$ is defined. In FIG. 5, as a pure spin current, $J_S$ flows in the upward direction in the drawing. Here, $J_S$ is a flow of electrons with a polarizability of 100%.

In FIG. 5, when a ferromagnetic component is brought into contact with the spin-orbit torque wiring 20, a pure spin current diffuses and flows into the ferromagnetic component. That is, when a current flows into the spin-orbit torque wiring 20 and a pure spin current is generated, the spin diffuses due to the pure spin current in the second ferromagnetic metal layer 3 in contact with the spin-orbit torque wiring 20. When the spin is injected into the second ferromagnetic metal layer 3 due to the pure spin current, magnetization inversion of the second ferromagnetic metal layer which is a free layer occurs due to a spin-orbit torque (SOT) effect.

The spin-orbit torque wiring 20 may include a nonmagnetic heavy metal. Here, "heavy metal" is used to refer to a metal having a specific gravity equal to or higher than that of yttrium. The spin-orbit torque wiring 20 may be made of only a nonmagnetic heavy metal.

The nonmagnetic heavy metal is preferably a nonmagnetic metal having a d electron or a f electron in the outermost shell and having a high atomic number of 39 or higher. For example, as the nonmagnetic heavy metal, a metal or an alloy containing at least one of metal atoms selected from the group consisting of tungsten, rhenium, osmium and iridium may be exemplified.

In such nonmagnetic heavy metals, spin orbit interaction causing a spin Hall effect is strong. Generally, when a current flows in a metal, all electrons move in a direction opposite to that of the current regardless of the direction of the spin. On the other hand, since a nonmagnetic metal having a d electron or a f electron in the outermost shell and having a high atomic number has a strong spin orbit interaction, a movement direction of electrons depends on a spin direction of electrons due to the spin Hall effect and a pure spin current $J_S$ is easily generated.

Since tungsten, rhenium, osmium and iridium have 5d electrons in the outermost shell and 5d orbitals are degenerate, they have a large orbital angular momentum. Therefore, in such materials, spin orbit interaction causing a spin Hall effect is stronger and a spin current can be efficiently generated.

The spin-orbit torque wiring 20 may contain a magnetic metal. The magnetic metal refers to a ferromagnetic metal or an anti-ferromagnetic metal. When a small amount of magnetic metal is contained in the nonmagnetic metal, the spin orbit interaction is enhanced, and a spin current generation efficiency with respect to a current that flows into the spin-orbit torque wiring 20 can be increased. The spin-orbit torque wiring 20 may be made of only an anti-ferromagnetic metal.

The spin orbit interaction is caused by the inherent internal field generated by a substance of a spin-orbit torque wiring material. Therefore, a pure spin current is generated also in the nonmagnetic material. When a small amount of magnetic metal is added to the spin-orbit torque wiring material, electron spins through which the magnetic metal itself flows are scattered and a spin current generation efficiency is improved. However, when an amount of the magnetic metal added excessively increases, the generated pure spin current is scattered by the added magnetic metal, and as a result, the spin current decreases. Therefore, a molar ratio of the added magnetic metal that is sufficiently smaller than a molar ratio of a main component of a pure spin generator in the spin-orbit torque wiring 20 is preferable. As a general rule, a molar ratio of the added magnetic metal is preferably 3% or less of the molar ratio of the main component of the pure spin generator.

The spin-orbit torque wiring 20 may include a topological insulator. The spin-orbit torque wiring 20 may be made of only a topological insulator. A topological insulator is a substance of which the inside is an insulator or a high resistor component and has a surface that is in a spin-polarized metal state. In the substance, an internal magnetic field called spin orbit interaction occurs. A substance in which a new topological phase develops due to a spin orbit interaction effect even if there is no external magnetic field is a topological insulator. A topological insulator can generate a pure spin current with high efficiency according to a strong spin orbit interaction and collapse of inversion symmetry at the edge.

As the topological insulator, for example, SnTe, $Bi_{1.5}Sb_{0.5}Te_{1.7}Se_{1.3}$, TlBiSe$_2$, Bi$_2$Te$_3$, and (Bi$_{1-x}$Sb)$_2$Te$_3$ are preferable. Such topological insulators can generate a spin current with high efficiency.

<First Control Element, Second Control Element, First Cell Selection Element>

As shown in FIG. 3 and FIG. 4, the first control element 13 is connected to the first wiring 11. The first control element 13 is connected to an external power supply (not shown) and is configured to control a current that flows into the first wiring 11.

Figure 6:
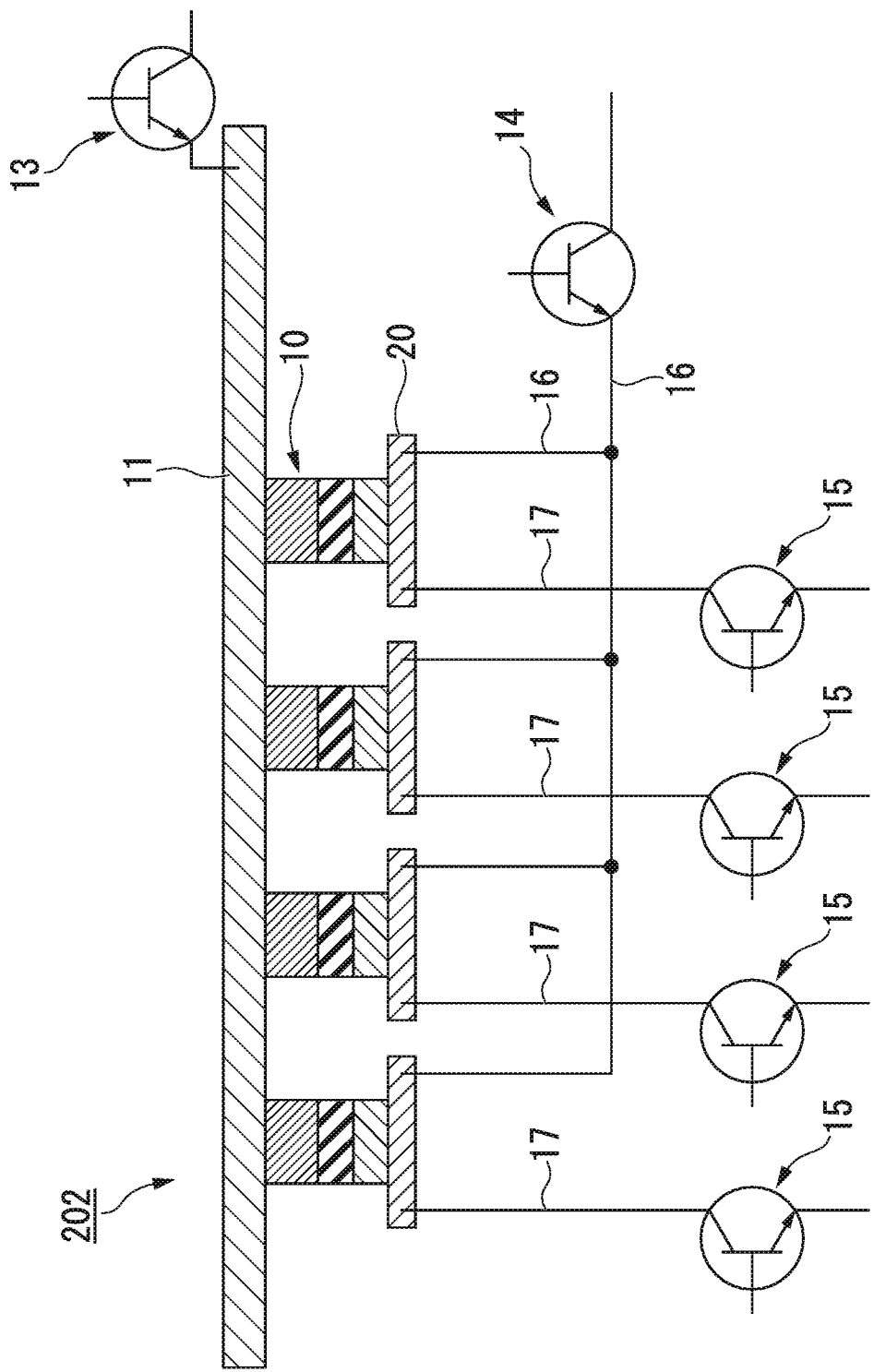
FIG. 6 is a schematic diagram of another example of the circuit structure of the magnetic memory according to the first embodiment.
Figure 7:
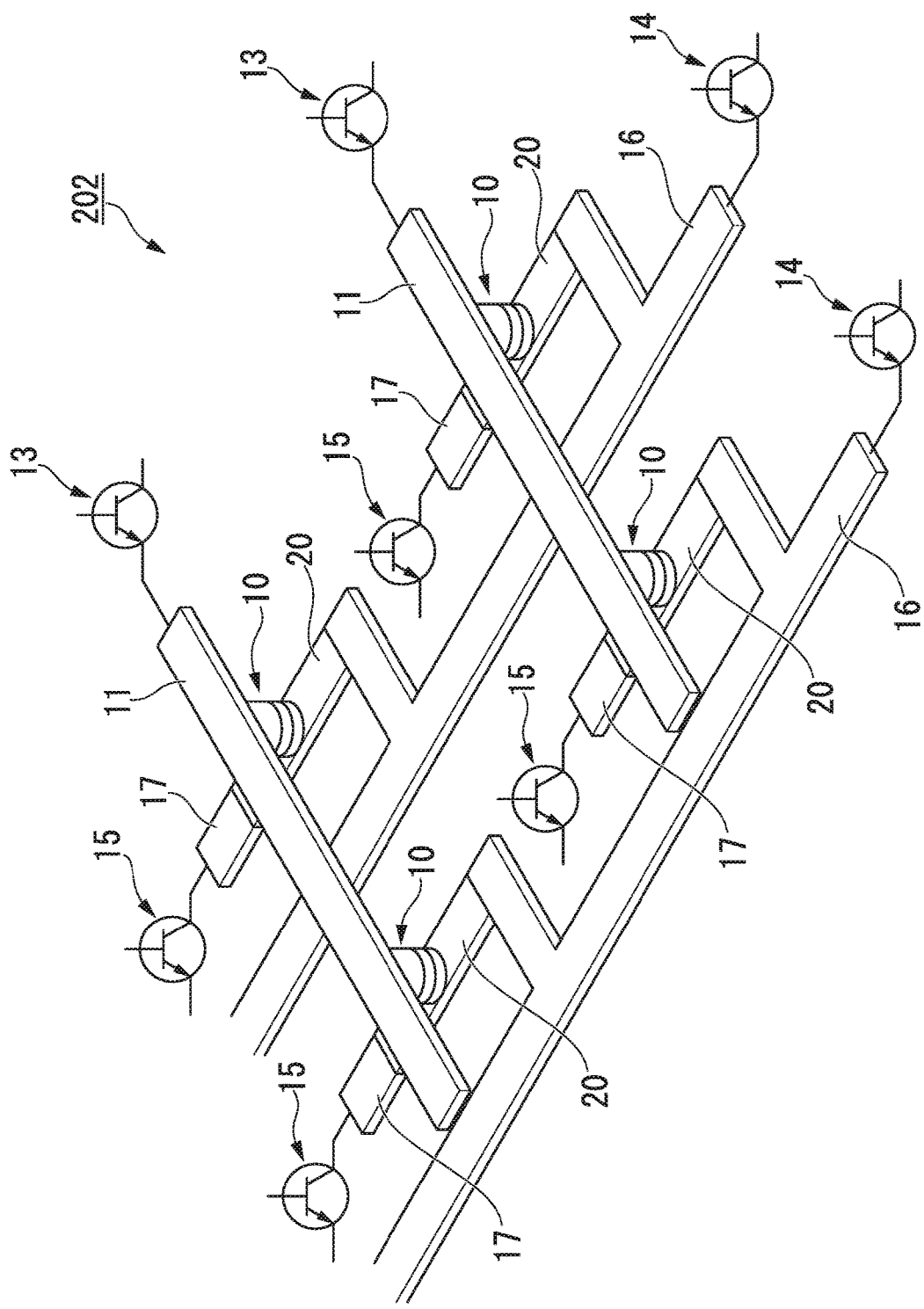
FIG. 7 is a schematic perspective view of another example of the circuit structure of the magnetic memory according to the first embodiment.

A plurality of first control elements 13 are not necessarily provided and the first wirings 11 may be connected to each other and only one first control element 13 may be provided. FIG. 6 is a schematic diagram of another example of a circuit structure of a magnetic memory 202 according to the first embodiment. FIG. 7 is a schematic perspective view of another example of a circuit structure of the magnetic memory 202 according to the first embodiment. FIG. 6 corresponds to a cross section taken along the first wiring 11 in FIG. 7.

As shown in FIG. 7, the first control element 13 in the magnetic memory 202 controls to which row of the plurality of magnetoresistance effect elements 10 disposed in a matrix form a current is applied. Therefore, when a current is applied to the first control element 13, a current reaches the plurality of magnetoresistance effect elements 10 through the first wiring 11, and a magnetoresistance effect element 10 in which a current flows can be controlled by the first cell selection element to be described below.

On the other hand, when the first wiring 11 is connected to the plurality of magnetoresistance effect elements 10, a leakage current may be generated along the wiring. For example, a current applied from the second control element 14 is a flow of a current that appropriately flows into the first cell selection element 15. However, some of the current can flow into the adjacent magnetoresistance effect element 10 through the magnetoresistance effect element 10 and the first wiring 11. In this case, this current causes noise in the magnetoresistance effect element 10.

Figure 8:
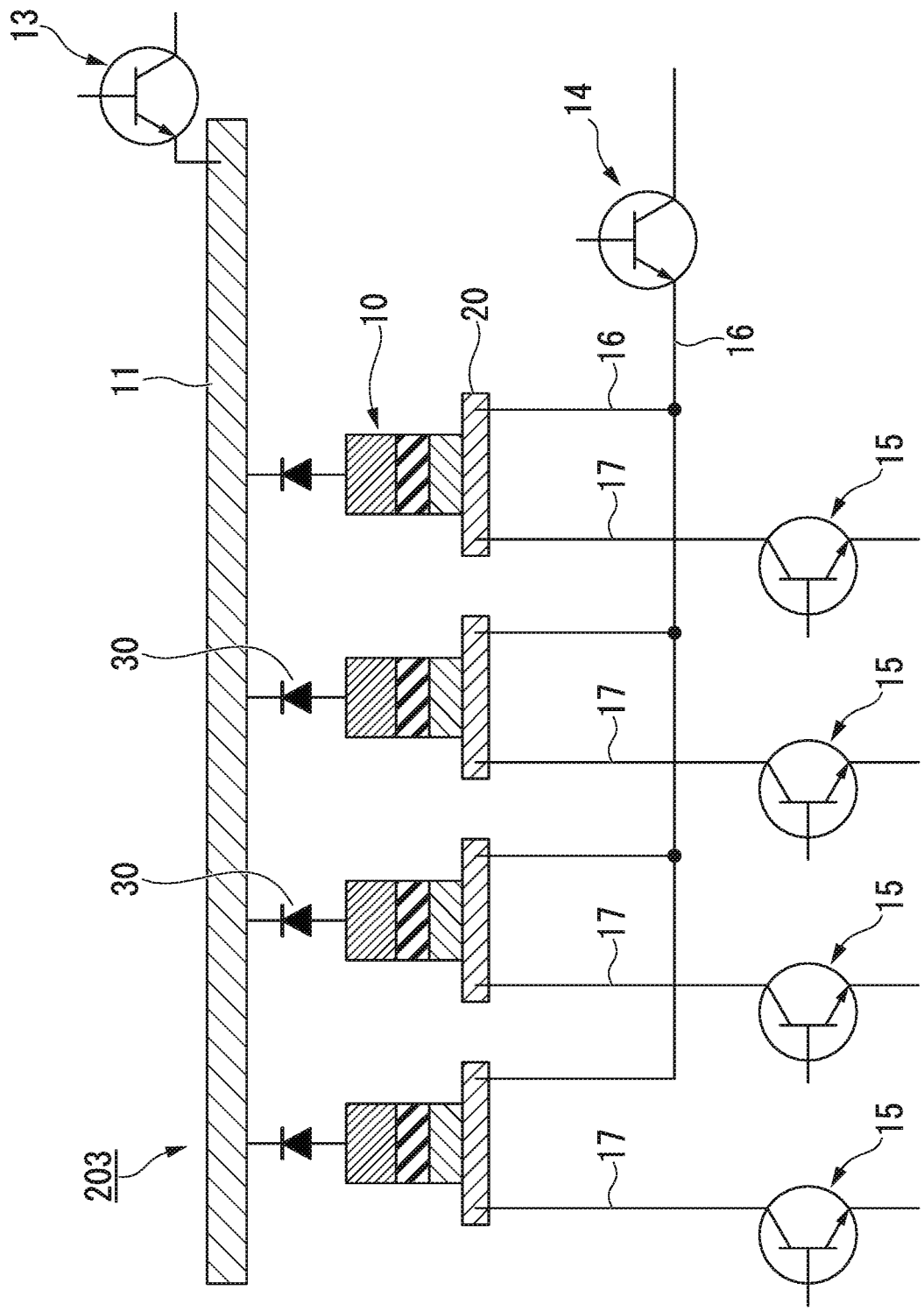
FIG. 8 is a schematic diagram of a circuit structure of a magnetic memory in which a rectifying element is provided.

Therefore, when the first wiring 11 is connected to the plurality of magnetoresistance effect elements 10, it is preferable to provide a method of preventing noise. FIG. 8 is a schematic diagram of a circuit structure of a magnetic memory 203 in which a rectifying element 30 is provided. As shown in FIG. 8, when the rectifying element 30 is provided between each of the magnetoresistance effect elements 10 and the first control element 13, a direction in which the current flows can be limited. When the direction in which the current flows is controlled, it is possible to prevent a leakage current from being generated and reduce the occurrence of noise.

A known diode can be used as the rectifying element 30. As long as the rectifying element 30 is arranged between the magnetoresistance effect element 10 and the first control element 13, the present invention is not limited to a case in which the rectifying element 30 is arranged between the first wiring 11 and the magnetoresistance effect element 10 shown in FIG. 8. For example, the rectifying element 30 may be provided along the way of the first wiring 11.

As another method of preventing noise, a potential of the first control element 13 may be set to be higher than a potential of the second control element 14. The first control element 13 controls a current that flows in a lamination direction of the magnetoresistance effect element 10 and the second control element 14 controls a current that flows in the extension direction of the spin-orbit torque wiring 20. Therefore, operations of the first control element 13 and the second control element 14 are independent of each other, and respective potentials can be freely set as long as they are higher than that of the first cell selection element 15. When a potential of the first control element 13 is higher than a potential of the second control element 14, a direction in which the current can flow is regulated to one direction, and the same effects as when the rectifying element 30 is provided can be obtained.

The second control element 14 is connected to the first connection point 20A of each of the plurality of spin-orbit torque wirings 20 through the second wiring 16. The second control element 14 is connected to an external power supply (not shown) and is configured to control a current that flows into the spin-orbit torque wiring 20. In FIG. 7, the second control element 14 controls to which column of the plurality of magnetoresistance effect elements 10 disposed in a matrix form a current is applied. Like the first control element 13, a plurality of second control elements 14 are not necessarily provided. For example, the second wirings 16 may be connected to each other and only one second control element 14 may be provided. In this case, a spin-orbit torque wiring 12 to which a current is applied can be controlled by the first cell selection element 15 to be described below.

In FIG. 1 to FIG. 8, the second wiring 16 that extends from one second control element 14 branches on the way, and is connected to each of the spin-orbit torque wirings 20. That is, since the number of second control elements 14 can be set to be smaller than the number of magnetoresistance effect elements 10, it is possible to improve the integration of the magnetic memory.

The first cell selection element 15 is connected to a second connection point 12B of each of the plurality of spin-orbit torque wirings 20 through the third wiring 17.

One first cell selection element 15 is provided for one magnetoresistance effect element 10. The first cell selection element 15 controls a magnetoresistance effect element 10 in which a write current and a read current flow. The first cell selection element 15 is grounded.

A known switching element can be used as the first control element 13, the second control element 14, and the first cell selection element 15. For example, a transistor element represented by a field effect transistor or the like can be used.

For the second wiring 16 and the third wiring 17, a material used for a general wiring can be used. For example, aluminum, silver, copper, gold, or the like can be used.

As shown in FIG. 4, preferably, the magnetoresistance effect element 10 is provided at a position between the first connection point 20A and the second connection point 20B when viewed in a lamination direction of the magnetoresistance effect element 10. In other words, the magnetoresistance effect element 10 is interposed between the first connection point 20A and the second connection point 20B when viewed in the lamination direction.

A current supplied from the second wiring 16 flows into the spin-orbit torque wiring 20 through the first connection point 20A. A current that flows into the spin-orbit torque wiring 20 flows into the third wiring 17 through the second connection point 20B. That is, a main direction of a current that flows into the spin-orbit torque wiring 20 is a direction from the first connection point 20A toward the second connection point 20B. When the magnetoresistance effect element 10 is arranged between the first connection point 20A and the second connection point 20B, the magnetoresistance effect element 10 is present at a position in which it is perpendicular to the main direction of the current, and the spin can then be efficiently supplied to the magnetoresistance effect element 10 by a pure spin current.

The configuration of the magnetic memory according to the present embodiment has been described above. A write operation and a read operation of the magnetic memory 200 will be described below with reference to FIG. 3.

<Write Operation>

There are two types of write operation.

The first method is a method in which writing (magnetization inversion) is performed using only a spin-orbit torque (SOT) induced by a pure spin current. The second method is a method in which writing according to a spin transfer torque (STT) or a voltage applied to the magnetoresistance effect element 10 is assisted by a spin-orbit torque (SOT).

First, the first method will be described.

In the first method, writing is controlled by the second control element 14 and the first cell selection element 15.

The second control element 14 is opened (connected), and the first cell selection element 15 to be opened is selected. The second control element 14 is connected to an external power supply and the first cell selection element 15 is grounded. Therefore, a first current path in which a current flows into the second control element 14, the second wiring 16, the spin-orbit torque wiring 20, the third wiring 17, and the selected first cell selection element 15 in that order is formed.

In the first current path, a current that flows into the spin-orbit torque wiring 20 induces a spin current. The spin current induced in the spin-orbit torque wiring 20 flows in the second ferromagnetic metal layer 3 (refer to FIG. 4) and applies a spin-orbit torque (SOT) to the spin in the second ferromagnetic metal layer 3. As a result, a direction of magnetization of the second ferromagnetic metal layer 3 of the magnetoresistance effect element 10 (hereinafter also referred to as a "selected cell") in which data is written is inverted. That is, when a current flows through the first current path, a write operation of the selected cell is performed.

Next, the second method will be described.

In the second method, writing is controlled by the first control element 13, the second control element 14, and the first cell selection element 15.

The first control element 13 and the second control element 14 are opened (connected), and the first cell selection element 15 to be opened is selected. The first control element 13 and the second control element 14 are connected to an external power supply, and the first cell selection element 15 is grounded. Therefore, two current paths are formed.

As in the first method, the first current path is a path in which a current flows into the second control element 14, the second wiring 16, the spin-orbit torque wiring 20, the third wiring 17, and the selected first cell selection element 15 in that order.

The second current path is a path in which a current flows into the first control element 13, the first wiring 11, the magnetoresistance effect element 10, the spin-orbit torque wiring 20, the third wiring 17, and the selected first cell selection element 15 in that order.

As in the first method, a current that flows through the first current path induces a spin-orbit torque (SOT). Since a current that flows through the second current path flows in a lamination direction of the magnetoresistance effect element 10, a spin transfer torque (STT) is induced. As a result, a direction of magnetization of the second ferromagnetic metal layer 3 of the selected cell receives a spin-orbit torque and spin transfer torque and is inverted. That is, a write operation of the selected cell is performed by an STT and SOT.

Here, when a resistance of the magnetoresistance effect element 10 is high, an amount of a current that flows through the second current path is small. For example, when an area resistance of the nonmagnetic layer 2 constituting the magnetoresistance effect element 10 is higher than $1000\ \Omega\cdot\mu m^2$, an amount of a current that flows through the second current path is very small. In this case, there is a potential difference in the lamination direction of the magnetoresistance effect element 10, and a voltage is applied to the magnetoresistance effect element 10. It is known that magnetization inversion is caused by a voltage difference, and a voltage difference applied to the magnetoresistance effect element 10 may be used.

<Read Operation>

The read operation is performed by applying a current to the above second current path. The flowing current is a current that is not sufficient to invert a direction of magnetization of the second ferromagnetic metal layer 3.

In the magnetoresistance effect element, the resistance value differs between a selected cell in which writing is performed and a non-selected cell in which no writing is performed. This is because the resistance value of the magnetoresistance effect element 10 in the lamination direction differs between a case in which directions of magnetization of the first ferromagnetic metal layer 1 and the second ferromagnetic metal layer 3 are opposite (antiparallel) and a case in which directions of magnetization of the first ferromagnetic metal layer 1 and the second ferromagnetic metal layer 3 are the same (parallel).

The read operation is performed by reading a difference between resistance values of the magnetoresistance effect elements 10 as a potential difference between the first control element 13 and each of the first cell selection elements 15.

<Method of Producing Magnetic Memory>

The magnetic memory according to the present embodiment can be produced using a known method. A method of producing a magnetic memory will be described below.

A substrate on which a magnetic memory is fabricated is prepared. A substrate having excellent flatness is preferable. In order to obtain a surface having excellent flatness, for example, Si, or AlTiC, can be used as a material.

Next, the first wiring 11 is patterned on the substrate. The patterning is performed by, for example, a technique such as photolithography. The first ferromagnetic metal layer 1, the nonmagnetic layer 2, and the second ferromagnetic metal layer 3 are laminated in that order on the substrate on which the first wiring 11 is patterned. An underlayer may be provided between the substrate and the first ferromagnetic metal layer. The underlayer can control a crystal orientation of the layers including the first ferromagnetic metal layer 1 laminated on the substrate and a crystallinity such as a crystal grain size.

Such layers can be formed using, for example, a magnetron sputtering device. When the magnetoresistance effect element is a TMR element, the tunnel barrier layer can be formed when, for example, a metal thin film of about 0.4 to 2.0 nm containing aluminum and divalent cations of a plurality of nonmagnetic elements is sputtered on the first ferromagnetic metal layer 1 and oxidized by plasma oxidation or oxygen introduction, and additionally heated. As a film formation method, in addition to a magnetron sputtering method, thin film forming methods such as a vapor deposition method, a laser ablation method, and an MBE method can be used.

Next, a protective film such as a resist is provided on a part on which the magnetoresistance effect element 10 is desired to be fabricated, and unnecessary parts are removed using an ion milling method or a reactive ion etching (RIE) method. The removed unnecessary parts are filled with the insulating part 5 such as a resist and the upper surface is then flattened. According to the flattening, it is possible to reduce spin scattering at the interface between the spin-orbit torque wiring 20 to be formed next and the magnetoresistance effect element 10.

Next, a material constituting the spin-orbit torque wiring 20 is formed on the upper surface of the flattened magnetoresistance effect element 10. Sputtering or the like can be used for film formation.

Finally, the second wiring 16, the third wiring 17, the first control element 13, the second control element 14, and the first cell selection element 15 are fabricated.

The second wiring 16 and the third wiring 17 are fabricated only in a desired part by patterning or the like. The first control element 13, the second control element 14 and the first cell selection element 15 are obtained by fabricating a switching element such as a transistor using a known method. When a substrate to be fabricated is a substrate of a semiconductor such as silicon, the first control element 13, the second control element 14, and the first cell selection element 15 can be fabricated on the same substrate.

As described above, according to the magnetic memory of the present embodiment, the number of first control elements 13, second control elements 14 and first cell selection elements 15 for selecting the magnetoresistance effect element 10 can be reduced. That is, magnetoresistance effect elements using a pure spin current generated by spin orbit interaction can be efficiently integrated.

A top pin structure in which the second ferromagnetic metal layer 3 whose magnetization direction varies is on the side of the substrate has been described above.

The magnetoresistance effect element 10 according to the present embodiment is not limited to a top pin structure, and may have a bottom pin structure in which the first ferromagnetic metal layer 1 which is a fixed layer is on the side of the substrate.

Second Embodiment

Figure 9:
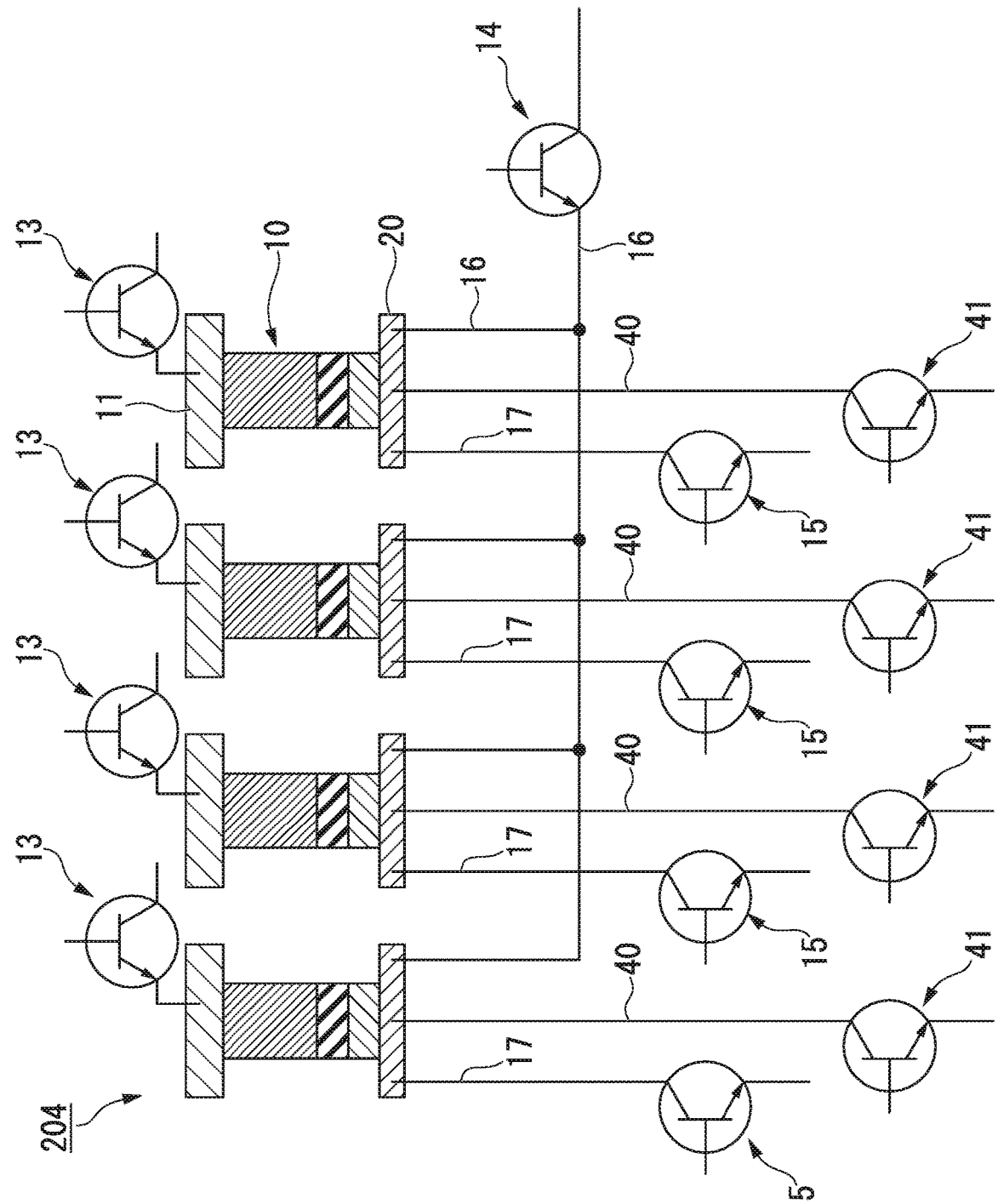
FIG. 9 is a schematic diagram of a circuit structure of a magnetic memory according to a second embodiment.
Figure 10:
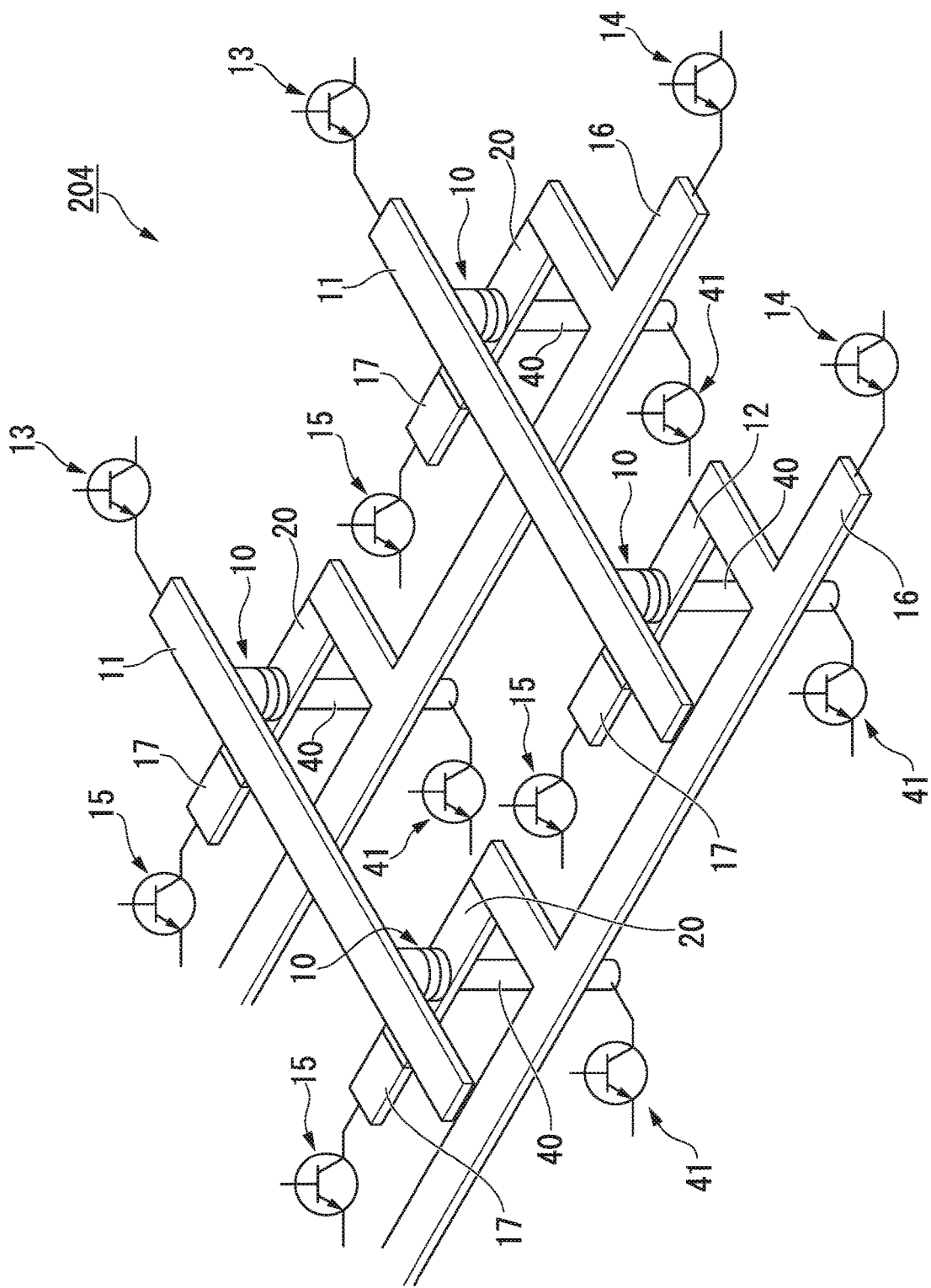
FIG. 10 is a schematic perspective view of a circuit structure of the magnetic memory according to the second embodiment.
Figure 11:
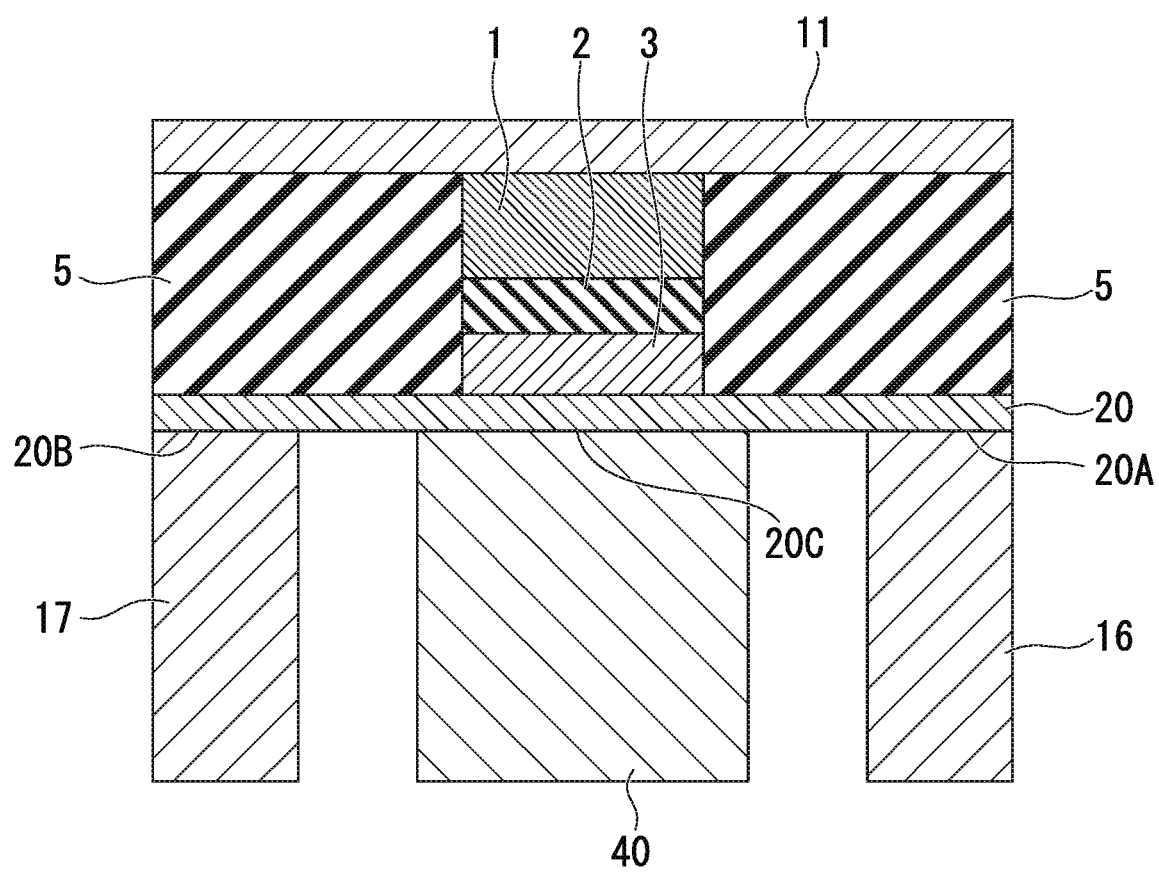
FIG. 11 is a schematic cross-sectional view of a main part in the vicinity of a magnetoresistance effect element of the magnetic memory according to the second embodiment.

FIG. 9 is a schematic diagram of a circuit structure of a magnetic memory according to a second embodiment. FIG. 10 is a schematic perspective view of the circuit structure of the magnetic memory according to the second embodiment. In addition, FIG. 11 is a schematic cross-sectional view of a main part in the vicinity of a magnetoresistance effect element of the magnetic memory according to the second embodiment. Components the same as those in the first embodiment will be denoted with the same reference numerals.

A magnetic memory 204 according to the second embodiment is different from the magnetic memory 200 according to the first embodiment in that a fourth wiring 40 and a second cell selection element 41 are included.

<Fourth Wiring and Second Cell Selection Element>

The fourth wiring 40 connects the magnetoresistance effect elements 10 to the second cell selection elements 41. One end of the magnetoresistance effect element 10 of the fourth wiring 40 is connected to a third connection point 20C. The third connection point 20C is provided at a position at which it overlaps the magnetoresistance effect element 10 from the lamination direction of the magnetoresistance effect element 10 in a plan view (refer to FIG. 11). The third connection point 20C is provided on the surface of the spin-orbit torque wiring 20 on the side opposite to the magnetoresistance effect element 10.

Similarly to the second wiring 16 and the third wiring 17, a material used for a general wiring can be used for the fourth wiring 40.

A known switching element can be used as the second cell selection element 41.

For example, a transistor element represented by a field effect transistor or the like can be used.

<Write Operation and Read Operation>

In the magnetic memory 204 according to the second embodiment, a path during the read operation differs. The write operation is performed in the same manner as in the magnetic memory 200 according to the first embodiment.

Reading of the magnetic memory 204 according to the second embodiment is performed in the following third current path.

The third current path is a path in which a current flows into the first control element 13, the first wiring 11, the magnetoresistance effect element 10, the spin-orbit torque wiring 20, the fourth wiring 40, and the second cell selection element 41 in that order.

The third current path is different from the second current path which is a read path in the magnetic memory 200 according to the first embodiment in that a current that flows into the spin-orbit torque wiring 20 has a different direction. In the second current path, a current flows in the extension direction of the spin-orbit torque wiring 20 between the magnetoresistance effect element 10 and the third wiring 17. On the other hand, in the third current path, a current flows in a direction intersecting the extension direction of the spin-orbit torque wiring 20. This is because the magnetoresistance effect element 10 and the fourth wiring 40 are provided at positions at which the third connection points overlap in the lamination direction of the magnetoresistance effect element 10.

The spin-orbit torque wiring 20 has a higher resistivity than a general wiring such as the fourth wiring 40. The wiring resistance of the spin-orbit torque wiring 20 is a cause of the circuit resistance in the entire magnetic memory 200. When a read current during reading is applied in a direction intersecting the spin-orbit torque wiring 20, a ratio of the wiring resistance to the total circuit resistance can be reduced.

When a proportion of the wiring resistance in the entire circuit is smaller, a difference between magnetoresistive ratios of the magnetoresistance effect elements 10 is easily determined. Since the magnetic memory 204 reads data according to a difference between magnetoresistive ratios of the magnetoresistance effect elements 10, the reliability of data is improved.

Third Embodiment

Figure 12:
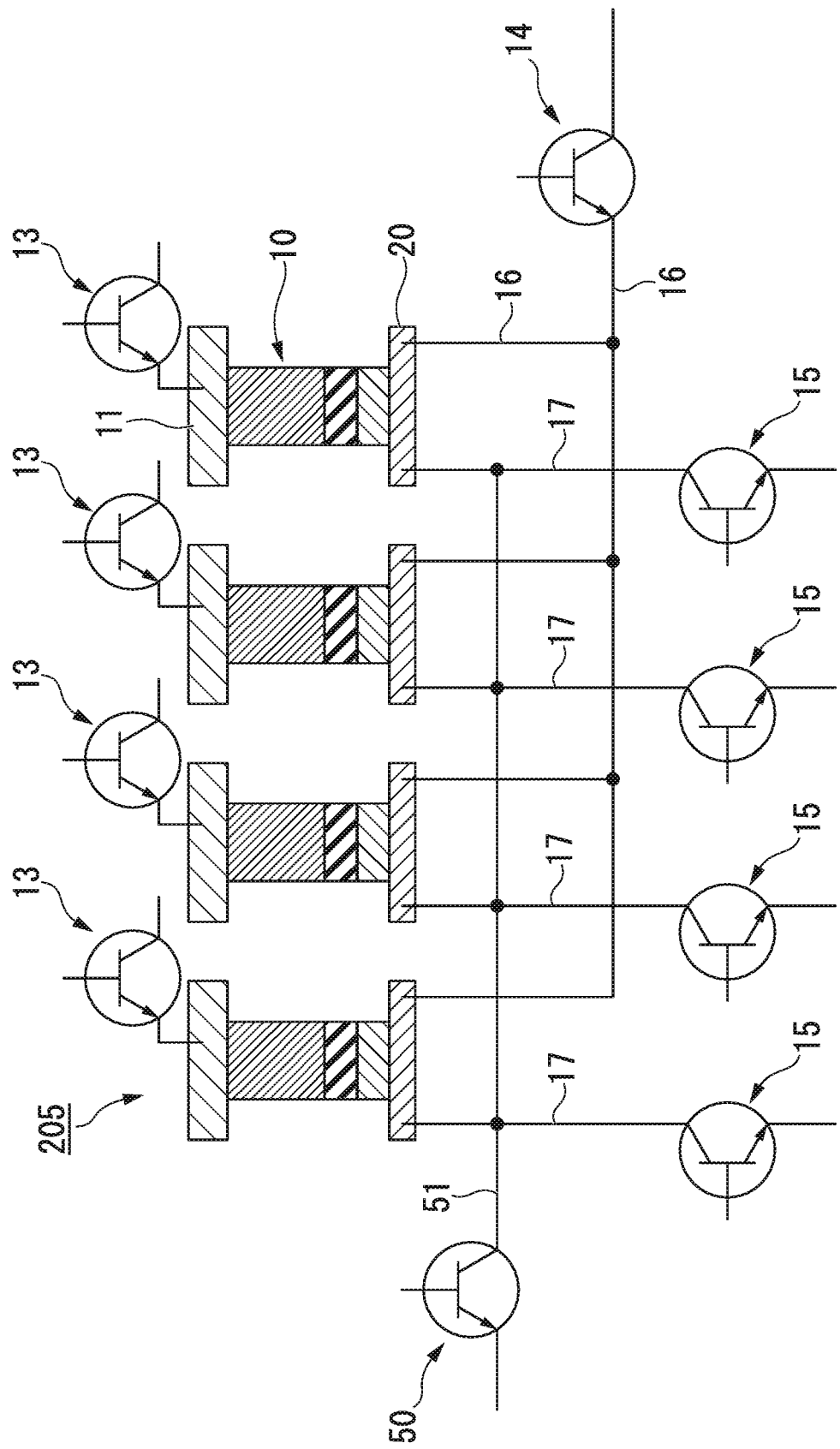
FIG. 12 is a schematic diagram of a circuit structure of a magnetic memory according to a third embodiment.
Figure 13:
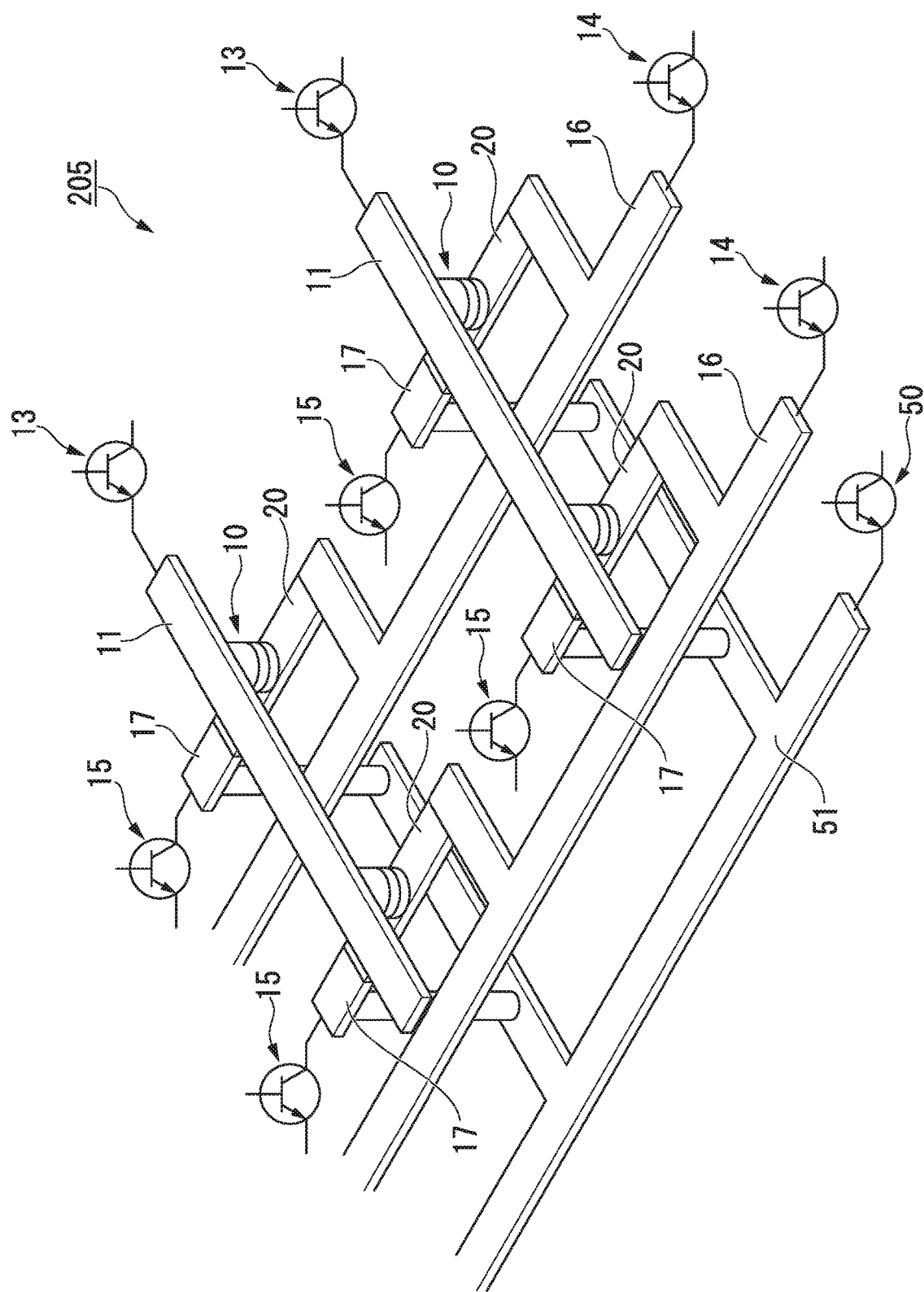
FIG. 13 is a schematic perspective view of a circuit structure of the magnetic memory according to the third embodiment.

FIG. 12 is a schematic diagram of a circuit structure of a magnetic memory according to a third embodiment. FIG. 13 is a schematic perspective view of a circuit structure of a magnetic memory according to the third embodiment. In the drawings, components the same as those in the first embodiment will be denoted with the same reference numerals.

A magnetic memory 205 according to the third embodiment is different from the magnetic memory 200 according to the first embodiment in that a data erasing element 50 and a fifth wiring 51 are included.

<Fifth Wiring and Data Erasing Element>

As shown in FIG. 12 and FIG. 13, the data erasing element 50 is connected to the third wirings 17 connected to the spin-orbit torque wirings 20. The data erasing element 50 is connected to the second connection point 20B of the spin-orbit torque wiring 20 through the fifth wiring 51 and the third wirings 17.

A known switching element can be used as the data erasing element 50. For example, a transistor element represented by a field effect transistor or the like can be used.

Similarly to the second wiring 16 and the third wiring 17, a material used for a general wiring can be used for the fifth wiring 51.

A write operation and a read operation of the magnetic memory 205 according to the third embodiment are the same as those of the magnetic memory 200 according to the first embodiment.

The magnetic memory 205 according to the third embodiment can perform an operation of erasing data.

The erasing operation is performed by the second control element 14 and the data erasing element 50. When the second control element 14 and the data erasing element 50 are opened, the following fourth current path is formed.

The fourth current path is a path in which a current flows into the second control element 14, the second wiring 16, the spin-orbit torque wirings 20, the third wirings 17, the fifth wiring 51, and the data erasing element 50 in that order. In this case, a potential of the data erasing element 50 is preferably lower than a potential of the second control element 14 so that an inappropriate current path causing noise is not formed.

When a current flows through the fourth current path, the spin current from each of the spin-orbit torque wirings 20 flows the second ferromagnetic metal layer 3 of each of the magnetoresistance effect elements 10. As a result, directions of magnetization of the second ferromagnetic metal layers 3 of the magnetoresistance effect elements 10 are inverted. In the fourth current path, a current is supplied to all of the spin-orbit torque wirings 20. Therefore, after a current flows through the fourth current path, a direction of magnetization of the second ferromagnetic metal layer 3 with respect to a direction of magnetization of the first ferromagnetic metal layer 1 is the same as in all of the magnetoresistance effect elements 10. That is, when collective writing is performed, data of the all of the magnetoresistance effect elements 10 becomes "1" or "0," and data is substantially erased.

Generally, the magnetic memory has a feature that it can maintain data. Therefore, it is important to reliably rewrite respective items of data, and collective control of data is difficult. On the other hand, there is a strong demand for collective control (erasing) of data when a data medium is discarded.

For example, in the case of a magnetic memory that performs magnetization inversion using a spin transfer torque (STT) effect, in order to invert magnetization of all of the magnetoresistance effect elements, it is necessary for a current to flow parallel to the lamination direction of the magnetoresistance effect elements. This is possible when the number of magnetoresistance effect elements is small. However, when the number of magnetoresistance effect elements increases, a current source having a very large capacity is necessary. In addition, although a current can flow for each magnetoresistance effect element, it takes a long time to erase all data. On the other hand, the magnetic memory 205 according to the present embodiment can collectively control data.

Fourth Embodiment

Figure 14:
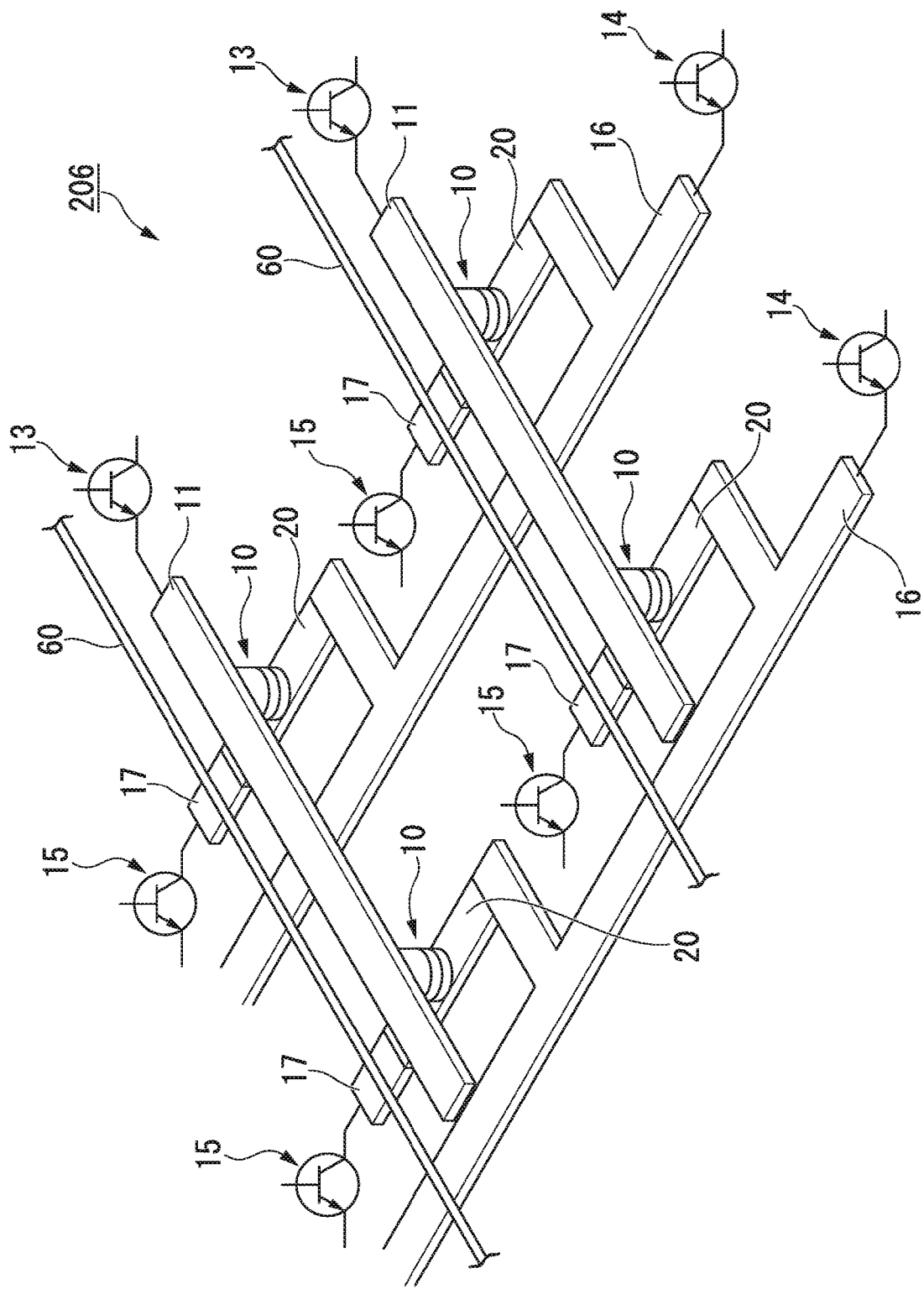
FIG. 14 is a schematic perspective view of a circuit structure of a magnetic memory according to a fourth embodiment.

FIG. 14 is a schematic diagram of a circuit structure of a magnetic memory according to a fourth embodiment. In the drawing, components the same as those in the first embodiment will be denoted with the same reference numerals.

A magnetic memory 206 according to the fourth embodiment is different from the magnetic memory 202 according to the first embodiment in that a magnetic field applying unit is included. In FIG. 14, a wiring 60 is arranged as the external magnetic field applying unit on a ferromagnetic metal layer 10. The extension direction of the wiring 60 is not limited to the direction in FIG. 14, and it may cross the extension direction of the wiring 60 shown in FIG. 14.

When a current is applied to the wiring 60, a magnetic field is generated around the wiring 60. This magnetic field serves as an external magnetic field for the magnetoresistance effect element 10. The second ferromagnetic metal layer 3 of the magnetoresistance effect element 10 is influenced by the external magnetic field. When a current flows into the wiring 60 and the external magnetic field is applied to the magnetoresistance effect element 10, it is possible to assist magnetization inversion by an SOT caused by a current flowing through the first current path and an STT caused by a current flowing through the second current path.

As shown in FIG. 14, the wiring 60 is formed at a height position that is different from that of a drive element including the magnetoresistance effect element 10 and the like. Therefore, the wiring 60 does not degrade integration of the magnetic memory.

The wiring 60 may be made of a highly conductive material. For example, aluminum, silver, copper, and gold can be used.

The external magnetic field applying unit is not limited to the wiring 60 as shown in FIG. 14. A magnetic field generating device using a coil or the like may be used.

REFERENCE SIGNS LIST

1: First ferromagnetic metal layer
2: Nonmagnetic layer
3: Second ferromagnetic metal layer
5: Insulating part
10: Magnetoresistance effect element
11: First wiring
20: Spin-orbit torque wiring
21, 22: Resistor
13: First control element
14: Second control element
15: First cell selection element
16: Second wiring
17: Third wiring
40: Fourth wiring
41: Second cell selection element
50: Data erasing element
51: Fifth wiring
60: Wiring
100: Drive element
200, 201, 202, 203, 204, 205, 206: Magnetic memory

What is claimed is:

1. A magnetic memory comprising:
a magnetoresistance effect element that includes a first ferromagnetic metal layer in which a magnetization direction is fixed, a second ferromagnetic metal layer for a magnetization direction to be changed, and a nonmagnetic layer that is provided between the first ferromagnetic metal layer and the second ferromagnetic metal layer;
a plurality of drive elements, each of which is connected to the second ferromagnetic metal layer of the magnetoresistance effect element and includes spin-orbit torque wirings extending in a direction intersecting a lamination direction of the magnetoresistance effect element;
a plurality of first control elements that are connected to each of the first ferromagnetic metal layers of the plurality of drive elements;
at least one second control element that is connected to a first connection point of spin-orbit torque wirings of at least two drive elements among the plurality of drive elements; and
a plurality of first cell selection elements, each of which is connected to each of second connection points of the spin-orbit torque wirings of the plurality of drive elements, respectively,
wherein the spin-orbit torque wirings include a nonmagnetic metal having a d electron or a f electron in the outermost shell and having an atomic number of 39 or higher.

2. The magnetic memory according to claim 1, wherein the magnetoresistance effect element is interposed between the first connection point and the second connection point when viewed from the lamination direction.

3. The magnetic memory according to claim 1, further comprising:
a plurality of second cell selection elements, each of which is connected to each of third connection points of the plurality of spin-orbit torque wirings, wherein the third connection points are provided at positions at which the third connection points overlap the magnetoresistance effect element when viewed from the lamination direction.

4. The magnetic memory according to claim 1, further comprising:
a data erasing element that is connected to each of the second connection points of the plurality of spin-orbit torque wirings and is configured to collectively control directions of magnetization of the second ferromagnetic metal layers of the plurality of magnetoresistance effect elements.

5. The magnetic memory according to claim 1, wherein, when the first wiring is connected to the plurality of magnetoresistance effect elements, a rectifying element is provided between each of the plurality of magnetoresistance effect elements and the first control element.

6. The magnetic memory according to claim 1, wherein a potential of the first control element is higher than a potential of the second control element.

7. A magnetic memory comprising:
a magnetoresistance effect element that includes a first ferromagnetic metal layer in which a magnetization direction is fixed, a second ferromagnetic metal layer for a magnetization direction to be changed, and a nonmagnetic layer that is provided between the first ferromagnetic metal layer and the second ferromagnetic metal layer;
a plurality of drive elements, each of which is connected to the second ferromagnetic metal layer of the magnetoresistance effect element and includes spin-orbit torque wirings extending in a direction intersecting a lamination direction of the magnetoresistance effect element;
a plurality of first control elements that are connected to each of the first ferromagnetic metal layers of the plurality of drive elements;
at least one second control element that is connected to a first connection point of spin-orbit torque wirings of at least two drive elements among the plurality of drive elements; and
a plurality of first cell selection elements, each of which is connected to each of second connection points of the spin-orbit torque wirings of the plurality of drive elements, respectively,
wherein an area resistance of the nonmagnetic layer is higher than 1000 $\Omega \cdot \mu m^2$.

8. The magnetic memory according to claim 7, wherein the spin-orbit torque wirings include a nonmagnetic metal having a d electron or a f electron in the outermost shell and having an atomic number of 39 or higher.

9. A magnetic memory comprising:
a magnetoresistance effect element that includes a first ferromagnetic metal layer in which a magnetization direction is fixed, a second ferromagnetic metal layer for a magnetization direction to be changed, and a nonmagnetic layer that is provided between the first ferromagnetic metal layer and the second ferromagnetic metal layer;
a plurality of drive elements, each of which is connected to the second ferromagnetic metal layer of the magnetoresistance effect element and includes a spin-orbit torque wiring extending in a direction intersecting a lamination direction of the magnetoresistance effect element;
at least one first control element that is connected to the first ferromagnetic metal layer of at least two drive elements among the plurality of drive elements;
a plurality of second control elements, each of which is connected to each of the first connection points, respectively of the spin-orbit torque wirings of the plurality of drive elements; and
a plurality of first cell selection elements, each of which is connected to each of second connection points of the spin-orbit torque wirings of the plurality of drive elements,
wherein the spin-orbit torque wirings include a nonmagnetic metal having a d electron or a f electron in the outermost shell and having an atomic number of 39 or higher.

10. A magnetic memory comprising:
a magnetoresistance effect element that includes a first ferromagnetic metal layer in which a magnetization direction is fixed, a second ferromagnetic metal layer for a magnetization direction to be changed, and a nonmagnetic layer that is provided between the first ferromagnetic metal layer and the second ferromagnetic metal layer;
a plurality of drive elements, each of which is connected to the second ferromagnetic metal layer of the magnetoresistance effect element and includes a spin-orbit torque wiring extending in a direction intersecting a lamination direction of the magnetoresistance effect element;
at least one first control element that is connected to the first ferromagnetic metal layer of at least two drive elements among the plurality of drive elements;
a plurality of second control elements, each of which is connected to each of the first connection points, respectively of the spin-orbit torque wirings of the plurality of drive elements; and
a plurality of first cell selection elements, each of which is connected to each of second connection points of the spin-orbit torque wirings of the plurality of drive elements,
wherein an area resistance of the nonmagnetic layer is higher than 1000 $\Omega * \mu m^2$.

* * * * *